United States Patent [19]

Hui et al.

[11] Patent Number: 4,884,118
[45] Date of Patent: Nov. 28, 1989

[54] DOUBLE METAL HCMOS COMPACTED ARRAY

[75] Inventors: Alex C. Hui, Palto Alto; Anthony Y. Wong, Cupertino; Conrad J. Dell'Oca, Palto Alto; Daniel Wong, San Jose; Roger Szeto, San Jose, all of Calif.

[73] Assignee: LSI Logic Corporation, Milpitas, Calif.

[21] Appl. No.: 158,066

[22] Filed: Feb. 12, 1988

Related U.S. Application Data

[63] Continuation of Ser. No. 865,071, May 19, 1986, abandoned.

[51] Int. Cl.⁴ .................. H01L 29/52; H01L 29/78; H01L 27/10
[52] U.S. Cl. ................................ 357/45; 357/42; 357/71
[58] Field of Search .................. 357/42, 45, 71

[56] References Cited

U.S. PATENT DOCUMENTS

| | | |
|---|---|---|
| 4,280,272 | 7/1981 | Egawa et al. ............ 357/42 |
| 4,412,237 | 10/1983 | Matsumura et al. ........ 357/41 |
| 4,701,777 | 10/1987 | Takayama et al. ......... 357/45 |

FOREIGN PATENT DOCUMENTS

| | | | |
|---|---|---|---|
| 0177336 | 4/1986 | European Pat. Off. ....... | 357/45 |
| 59-11670 | 1/1984 | Japan ...................... | 357/45 |
| 59-44859 | 3/1984 | Japan ...................... | 357/45 |
| 59-44860 | 3/1984 | Japan ...................... | 357/45 |
| 60-47440 | 3/1985 | Japan ...................... | 357/45 |
| 60-74548 | 4/1985 | Japan ...................... | 357/45 |
| 60-74646 | 4/1985 | Japan ...................... | 357/45 |

Primary Examiner—Andrew J. James
Assistant Examiner—Jerome Jackson, Jr.
Attorney, Agent, or Firm—Skjerven, Morrill, MacPherson, Franklin & Friel

[57] ABSTRACT

A gate array is provided in which active areas within the substrate are arranged in alternating columns of opposite conductivity type and symmetrical about the center lines through each column so that CMOS devices can be advantageously formed by allocating only small increments of active area to metal routing. The substrate and well taps are also symmetrical about the column center line. The active area symmetry allows p-channel and n-channel transistors to be combined where the p-channel transistor is on either the right or left, thus increasing the flexibility in placing the elements within the integrated circuit chip.

6 Claims, 8 Drawing Sheets

DOUBLE METAL HCMOS COMPACTED ARRAY

This application is a continuation of application Ser. No. 865,071 filed May 19, 1986.

FIELD OF THE INVENTION

This invention relates to a high-performance B complementary metal-oxide-semiconductor (HCMOS) logic array and in particular to an HCMOS logic array having no predefined routing channels.

BACKGROUND OF THE INVENTION

Gate arrays are used in VLSI integrated circuit chips to implement MOSFET circuits in semiconductor wafers. An MOS gate array consists of an array of MOS transistor sources and drains separated by channels, above which are formed gates to control the conductivity of the channels and thus the state of the transistors. An array of these gates (and their sources and drains) becomes functional only when connected by conductive wiring to appropriate other elements Generally, the connecting is accomplished in two steps: a library of macrocells is available to translate simple frequently used logic functions such as NAND, flip-flop, ADD, multiplexer, and counter into a gate array wiring pattern, then the macrocells are connected together to form the complex logic function of the VLSI chip.

Although conceptually there are two steps, the actual metallization to accomplish the two steps is laid out in as few layers as possible, preferably two, so the metal to implement a single macrocell and the metal to connect macrocells to each other is in the same metallization layers. Therefore if an area in a metal layer is used for connecting points within a macrocell, it is not also available for connecting macrocells to each other.

There has been considerable interest in implementing complex logic operations on smaller areas of semiconductor material, while simultaneously retaining the flexibility provided by a gate array in which identical structural units repeat throughout a large portion of the semiconductor area. A gate array structure consists generally of a base array of many active areas which can be fabricated as a standard product on which is formed one or more "personality layers" comprising conductive material to interconnect the active areas into a desired logical structure. The personality layers reflect the function or functions to be B implemented by the finished array. A given base array can be used to implement many different functions by appropriately designing the personality layers. Thus a gate array allows many different logic functions to be implemented using the same base array. The geometry of the base array cell affects the ability of the designer using later metallization to achieve a final product having maximum density and performance.

FIG. 1 shows a partial schematic diagram of a typical prior art layout for an HCMOS logic array. Column Cl lB contains a plurality of n-channel active areas denoted by Nll, N21, N31....Nk1...NK1 formed in a p-well where K is an integer representing the number of elements (such as HCMOS transistors) in the column and k is an integer given by $1 \leq k \leq K$. Column C2 contains a plurality of p-channel active areas P12, P22, P32...Pk2...PK2 formed in an n-type substrate. In general, the odd columns Cl, C3, C5, etc. contain n-channel active areas for forming n-channel transistors and the even columns C2, C4, etc. contain p-channel active areas for forming p-channel transistors. The columns are arranged in pairs each pair containing a column of n-channel active areas and a column of p-channel active areas. Each column also contains a plurality of K p+ well taps such as column 1 well taps T11, T21, T31, ...Tk1...TK1 or n+ substrate taps T12, T22, T32, ...Tk2...TK2 for connecting metal to the substrate or well. For example, tap T11 in column Cl is a p+ p-well tap and tap T12 in column C2 is an n+ substrate tap.

The pairs of columns are separated by dedicated routing channels Rl, R2, etc. Each routing channel contains space for a fixed number of leads, called routing tracks, running on top of oxide isolation regions formed between the pairs of columns. In the interest of standardization and flexibility in implementing multiple functions with the same substrate layout, the same number of routing tracks is allocated to each routing channel within the array. The routing tracks are shown schematically in FIG. 1 by unnumbered parallel lines in each routing channel. Metallization (not shown) is formed above the active areas B in a particular pair of columns to connect elements within a macrocell and the routing tracks are used to provide the electrical interconnections between selected macrocells to implement the VLSI circuit.

The width of a routing channel depends on the number of routing tracks in the channel. In conventional gate array technology, the number of routing tracks per channel, typically 16 to 26, is chosen to provide good routability and typically increases with array size. This is satisfactory for many designs, but may lead to either an excess of tracks or to an under-utilization of the active areas in various pairs of columns. On the one hand, if the number of routing tracks per channel is sufficiently high to accommodate the traffic demands in a congested area of the chip then there is typically an excess of routing tracks in less congested areas of the chip with an attendant waste of silicon area. On the other hand, if the number of routing tracks allocated per channel is not enough to accommodate the desired interconnections for complex macrocells, then there is a waste of silicon area in regions where all adjacent routing tracks are already used or the interconnections must detour through other routing channels or use second metal. Either alternative is unsatisfactory. Detours are unsatisfactory because the increased conductor length increases capacitance and reduces speed. Use of a second conductive layer negates the simplicity of implementation provided by the dedicated routing channels. An insufficient number of routing tracks per channel also makes 100% auto-routing as provided by computer-aided design difficult to achieve in most designs.

The prior art layout shown in FIG. 1 has an additional disadvantage in that the use of dedicated routing channels alternating with pairs of transistor columns generally limits the width of the macrocell to the width of a single pair of columns. For complex macrocells, this leads to a very large height to width aspect ratio which is undesirable since wiring between parts of one macrocell would have to B extend a long distance within a single pair of columns, adding unwanted capacitance and reducing speed. Alternatively, if a large macrocell is implemented in more than one pair of columns, the wiring to connect with an adjacent pair of columns must span the width of one or more routing channels. Since the spanned routing channels are not used for either active areas or routing between macrocells, that routing channel area is wasted.

FIG. 2a shows another prior art layout (not intended for field effect transistor technology) which provides a regular 1B pattern of cells in a substrate area and dedicates no substrate area to routing channels. This layout may be used to form integrated circuit structures by providing at least two conductive layers above the substrate for personalized connections. Personalized connections may be made between active areas of the substrate in order to form simple logic gates and also to combine these simple logic gates to form complex functions on a single chip. One such device is described by Balyoz et al. in U.S. Pat. No. 4,249,193. FIG. 2b shows an inverter circuit to be implemented with this layout, as taught by Balyoz, and FIGS. 2c and 2d, show the substrate layout and metallization to implement the inverter circuit of FIG. 2b. The particular inverter circuit of FIG. 2b feeds multiple output points through Schottky diodes D1 through D6. These multiple contact points are labeled in FIGS. 2c and 2d. Ground and +V lines are shown as formed in first metal and running vertically through the structure while the metallization to connect to input point 11 and to output lines D1 through D6 is not shown.

While the geometry of FIG. 2a benefits over the geometry of FIG. 1 in not being restricted by fixed routing channels, the particular substrate areas of FIG. 2a have an orientation that serves only a few types of circuits. For example, the geometry of FIG. 2a having strips of active areas for forming bipolar transistors interposed with resistive strips is useful for the circuit of FIG. 2b but not for CMOS circuits. A prior art bipolar substrate geometry cannot be directly adapted for field effect transistor applications because of the need to accommodate formation of gates and channels. Further, a particular geometry for the formation of CMOS or HCMOS devices and for allowing maximum flexibility in implementing circuits using automatic routing with computer aided design is needed.

Reference is made to "A 4.1K Gates Double Metal HCMOS V 14 Sea of Gates Array" by A. Hui, A. Wong, C. Dell'Oca, D. Wong, and R. Szeto, Proceedings, IEEE 1985 Custom Integrated Circuits Conference, pages 15–16: and to "High Performance 129K Gate CMOS Array" by Tony Wong, Alex Hui, IB Daniel Wong, Teruo Kobayashi, Hiroaki Suzuki and Kinji Yamasaki, Proceedings of May 1986 Custom Integrated Circuits Conference, Rochester, N.Y. which provide background to understanding this invention and are incorporated herein by reference.

There has recently been an increased use of CMOS circcuitry because of the extremely low current requirements of CMOS devices. Therefore, particularly useful is a gate array layout that provides maximum density of active devices in a CMOS or HCMOS circuit. A CMOS circuit uses both p-channel and n-channel MOSFET transistors in series.

A gate array geometry that particularly accommodates adjacent formation of p-channel and n-channel transistors with CMOS transistors in an optimum circuit layout with minimum waste of silicon area and simultaneously allows for efficient implementation of large macrocells is desired.

SUMMARY

A novel compacted gate array geometry is provided wherein active areas are arranged in adjacent columns of alternating conductivity type with no intervening area allocated for metal routing. The placement of alternating conductivity type columns allows for formation of CMOS devices in which the p-type regions are on either the right or left sides of the devices depending upon the needs of the circuit. Thus, in a CMOS circuit application, if some substrate area must be left unused in order to allow for the most efficient placement of routing channels, less substrate area need be wasted in the overall layout since the next CMOS device may begin at the next column, either n or p, whichever is available. In very large circuits using many macrocells the flexibility in allocating silicon area to routing channels is increasingly important. This invention achieves high flexibility by allowing increments of a single column to be dedicated to routing. When the method of this invention is used with computer aided design, it is possible to achieve 100% automatic routing and still retain high utilization of chip area. Whereas prior art gate utilization is typically 35–40% of the die area, the compacted gate array geometry of this invention typically allows a gate utilization of 40–60% of the die area.

A further essential feature of this novel alternating column formation is that the active devices in each column must be symmetrical about a line through the center of that column, and the substrate taps and well taps must be centered about their respective lines of symmetry, unlike the prior art device of FIG. 1 having dedicated routing channels in which the substrate taps are located adjacent to the routing channels. This symmetry allows for combining pairs of active areas in either direction, that is the p-channel device may be located either right or left of the n-channel device with no change in performance of the CMOS device.

BRIEF DESCRIPTION OF THE DRAWINGS

FIGS. 2b–2d show a prior art inverter circuit and its implementation in the bipolar structure of FIG. 2a.

DETAILED DESCRIPTION

Figure 3:
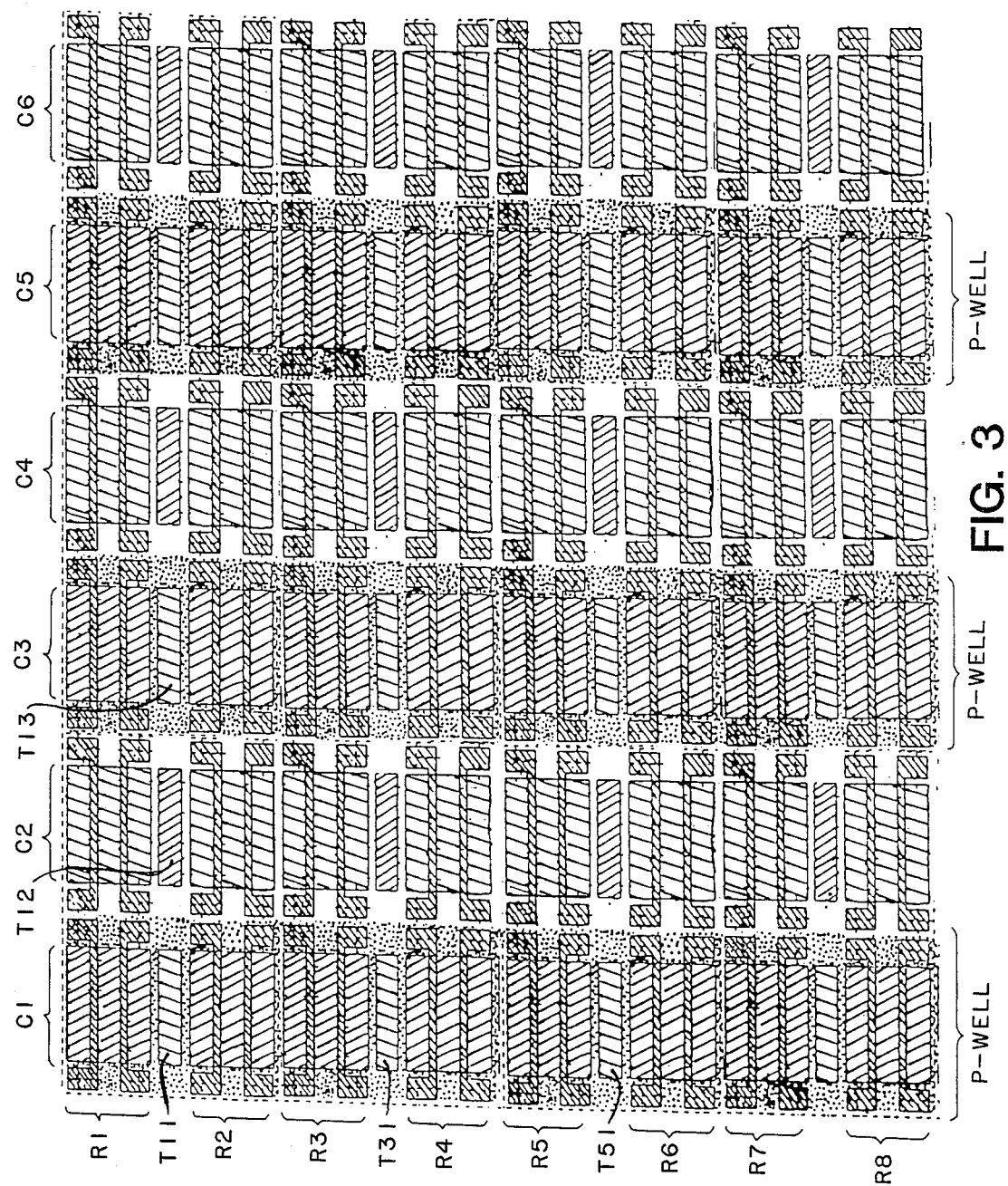
FIG. 3 shows a portion of a compacted gate array geometry of this invention.

FIG. 3 shows a partial top view of one embodiment of the compacted gate array of the present invention. In this embodiment, the array is implemented in a silicon chip having surface dimensions of 8.75 mm by 8.75 mm although other dimensions can, of course, be used if desired. This invention is not limited to any particular dimensions or size. In one embodiment, the chip contains 196 I/0 pads (not shown), has 109 adjacent columns of alternating conductivity type, each composed of 348 rows of active areas. The odd columns C1, C3, C5, etc., are formed in a p-well and the even columns C2, C4, C6, etc., are formed in the n-substrate. For the sake of simplicity, in FIG. 3 only columns C1–C6 and rows R1–R8 are shown. Each active area B comprises in succession a source/drain region, a channel above which is a gate, a second source/drain region, a second channel above which is a second gate, and a third source/drain region. Also located between every second active area is a tap region for making contact between metallization and the substrate or well region. In FIG. 3, not all tap regions are labeled.

Figure 4:
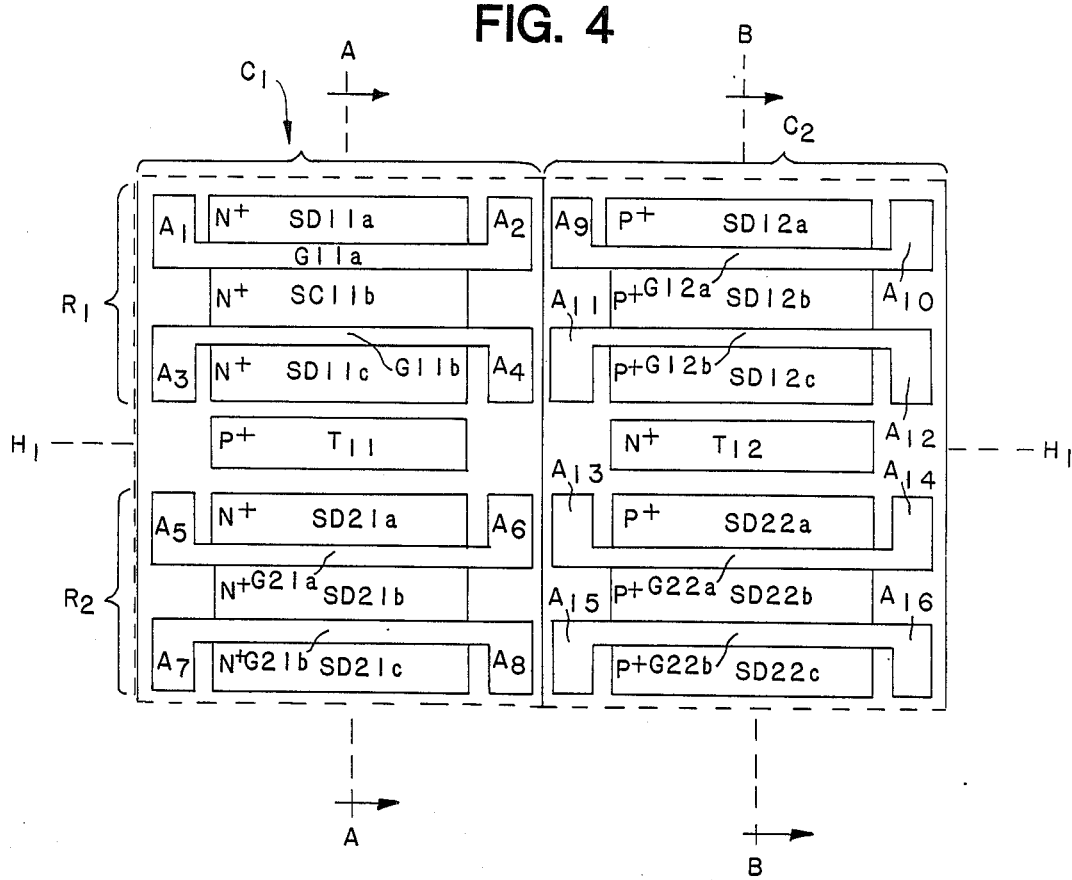
FIG. 4 shows a portion of FIG. 3 enlarged and having more detail.
Figure 5A:
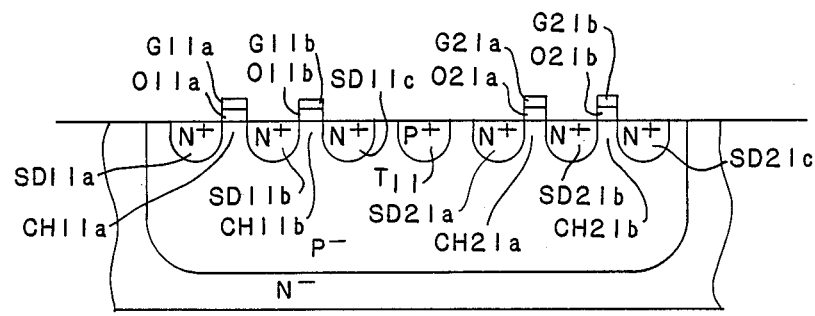
FIGS. 5a and 5b show cross sectional views of columns C1 and C2 of FIG. 4.

FIG. 4 shows in greater detail four of the active areas and the included substrate and well taps shown in FIG. 3, namely columns C1 and C2 and rows R1 and R2 of the compacted array of FIG. 3, including taps T11 and T12. In the area bounded by the intersection of the first row, first column (called R1C1—the numerals indicate the row and column numbers of the active area) is an active area comprising three N+ source drain regions SD11, SD11, and SD11c formed in the p-well of column C1. A side cross-sectional view of areas R1C1 and R2C1 with the intervening p well tap T11 cut along the center line A—A (FIG. 4) of column C1 is shown in FIG. 5a. Between source/drain region SD11a and source/drain region SD11 is a channel region CH11a on which is formed gate G11a for controlling the flow of current between these first two source/drain regions. Likewise between source/drain region SD11b and source/drain region SD11c is a channel region CH11b on which is formed gate G11b for controlling the flow of current between the second and third source/drain regions.

Active area R2C1 is identical to active area R1C1. Between the pair of active areas R1C1 and R2C1 is p+ well tap T11. This p-well tap allows the junction between the source/drain regions and the p-well in which these source-drain regions are to be back-biased formed.

Continuing down channel C1 (see FIG. 3), there is no p-well tap between the second and third active areas, R2C1 and R3C1. A tap between every other pair of active areas is sufficient to allow good voltage bias control of the well. Importantly, each source/drain region, channel, gate and tap in column C1 is symmetrical about a vertical center line A-A through column C1.

Figure 5B:
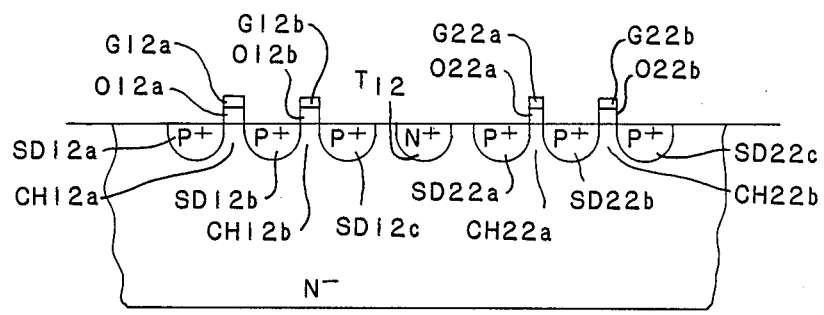

Column C2 is identical to column C1 except that conductivity types are reversed. Source/drain regions SD12a, SD12b and SD12c in active area R1C2 are p-type and are formed in an n-type substrate. Gates G12a and G12b control the channels between the three successive source/drain regions in active area R1C2. FIG. 5b is a cross section of areas R1C2 and R2C2 plus the intervening substrate tap T12 as cut along the center line B-B of FIG. 4.

All the odd columns are identical to column C1 and all the even columns are identical to column C2. All columns are symmetrical about a vertical line through the center of the column. Because of the symmetry and the absence of areas in the substrate allocated for routing channels, CMOS circuits can be formed by combining active areas in any two adjacent pairs of columns. There is no requirement to locate an even column on the right (or left) of each CMOS IB device, as was the case in the prior art array having allocated routing channels.

There is also symmetry about a horizontal line H1 (FIG. 4) running through the center of the substrate taps. Thus a substrate tap can be activated to serve the active area located immediately above or immediately below the tap. This horizontal symmetry also allows for great flexibility in forming devices through automatic metal routing and yet minimizes the substrate area dedicated to the taps.

In the embodiment shown in FIG. 3, the width of each column C1 through C78 is approximately 34 $\mu$m. This width is sufficient to accommodate six vertical routing tracks of first metal aluminum, each approximately 2.4 $\mu$m wide and spaced 3.2 $\mu$m apart. Of course, as stated earlier, this invention is not limited to a particular shape or size. The height of each row in the embodiment shown in FIG. 3 is approximately 17 $\mu$m, and the height of the substrate taps is approximately 4 $\mu$m. Three second metal routing tracks running in a horizontal direction can be placed above an active area and one above each substrate tap.

Figure 6A:
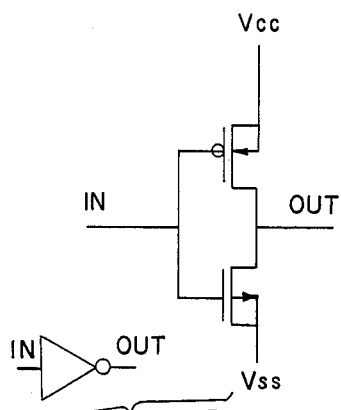
FIGS. 6a and 6b show a CMOS inverter circuit and its implementation in a compacted gate array structure of this invention.
Figure 6B:
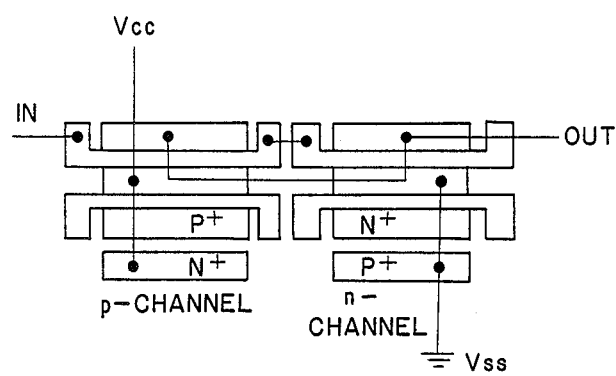
Figure 7A:
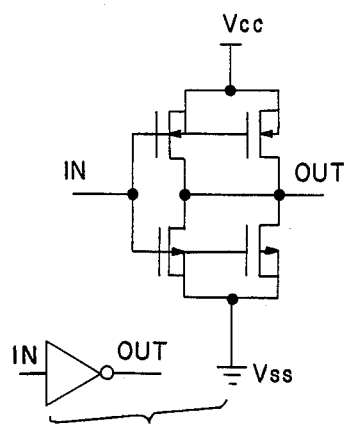
FIGS. 7a and 7b show a CMOS double inverter circuit and its implementation in a compacted gate array structure of this invention.
Figure 7B:
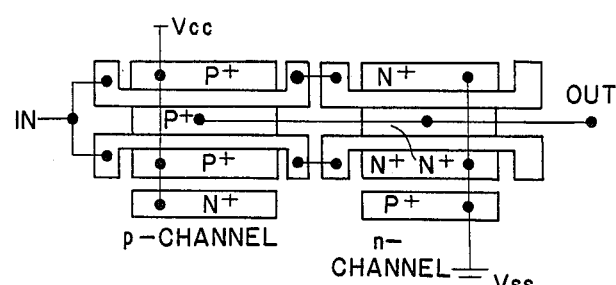

Looking at FIG. 4, a CMOS inverter can be formed using source/drain regions SD11a, SD11b, SD12a, and SD12b and gates G11a and G12a from active areas R1C1 and R1C2. FIG. 6a shows the circuit diagram of a CMOS inverter and FIG. 6b shows the layout of this inverter using source/drain regions SD11a, SD11b, SD12a and SD12b and gates G11a and G11b as labeled in FIG. 4. FIGS. 7a and 7b show the circuit and implementation of a double CMOS inverter using active areas R1C1 and R1C2.

Figure 8A:
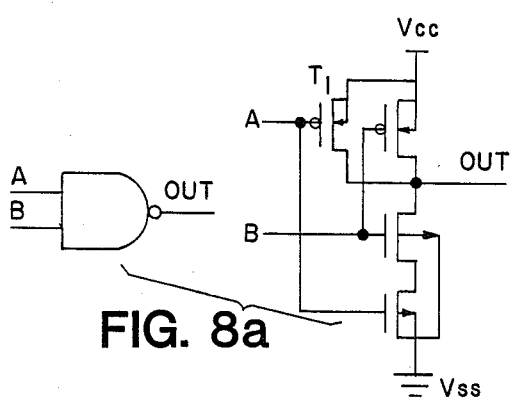
FIGS. 8a and 8b show a CMOS NAND circuit and its implementation in a compacted gate array structure of this invention.
Figure 8B:
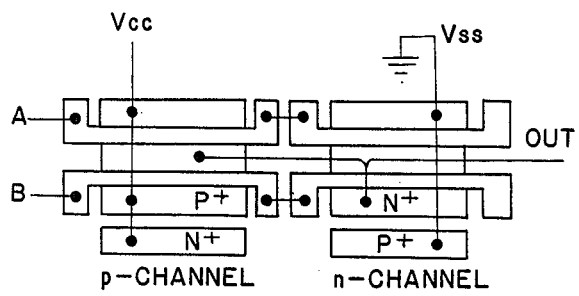

FIGS. 8a and 8b show another application of the compacted array structure of this invention to form a NAND gate. The geometry which provides three source/drain regions and two gates adjacent to an identical active area region of the opposite conductivity type also having three source/drain regions and two gates is a useful layout for implementing NAND or other simple logic functions repeatedly used in gate array applications. Adjacent p and n regions lB allow for the series connection and common gate control used in CMOS circuits. Further, providing three source/drain regions within the same active area allows for convenient series formation of transistors of the same type, for example, transistors T3 and T4 shown in FIG. 8a because no metal is needed to connect T3 to T4. Likewise forming three source/drain regions in the same active area allows for convenient parallel wiring of transistors, for example, T1 and T2 of FIG. 8a, since the central source/drain region serves as a common source or drain for the two parallel B transistors. The metallization for interconnecting active areas to form macrocells and the metallization for connecting macrocells to each other to implement the VLSI chip are generally able to be formed in first and second layer metal deposited in patterns above the compacted array. Because of the flexible application of the array of this invention, most VLSI HCMOS designs can be implemented using 100% automatic routing selected through computer aided design.

The compacted gate array shown in FIG. 3 also has an advantage over the prior art in that macrocells may be formed in a plurality of consecutive adjacent pairs of columns. In this way, the aspect ratio of the macrocells may be kept close to 1:1, thus providing efficient use of metal routing tracks without wasting silicon area. Further, as a particularly novel aspect of this invention, the symmetrical shape of each column allows the macrocell pattern to be flipped along a vertical axis, thus placing a p-channel on either the left side or the right of the macrocell. This means that a macrocell can be placed on the gate array starting with either a p-column or an n-column.

Figure 9:
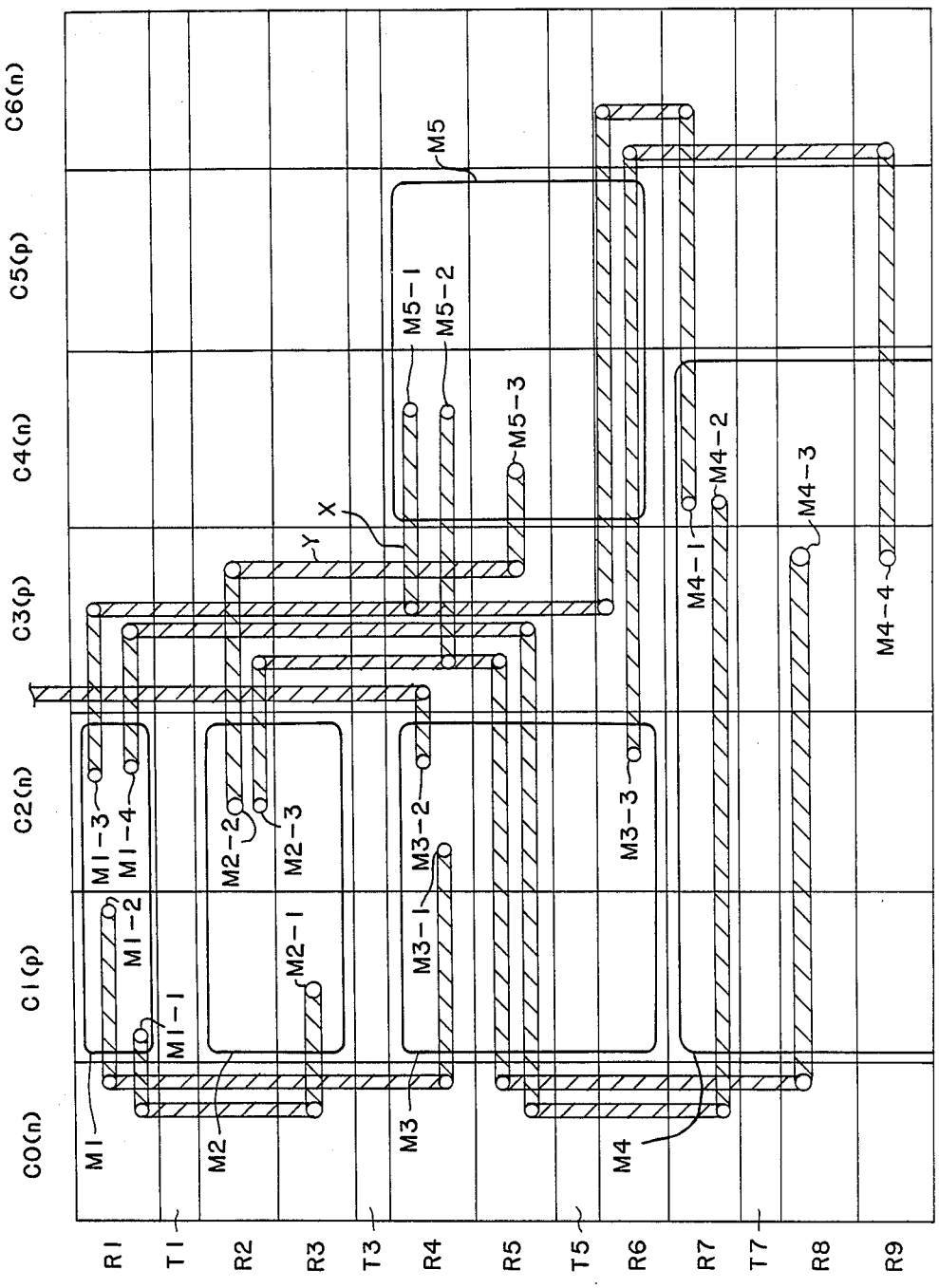
FIG. 9 shows a portion of a CMOS VLSI circuit and its implementation, taking advantage of the flexible gate array geometry taught by this invention.

FIG. 9 shows a portion of a VLSI chip which uses the array geometry of this invention. Seven columns and nine rows are shown. FIG. 9 shows the routing to connect macrocells to each other using only two layers of conductive material but does not show the routing within a macrocell as was shown in FIGS. 6b, 7b, and 8b, nor does it show the wiring to the tap regions. In this portion of the chip, macrocells M1 through M5 are placed and the routing to connect them is shown. Circles represent contact vias where metallization moves perpendicular to the plane of the paper. Leads running parallel to the columns, such as lead Y, represent first-metal connectors. Leads running parallel to the rows, such as lead X, represent second-metal connectors. Except where circles are present, first and second metal are not in electrical contact with each other. Macrocell M1 has four contact points/, M1-1 through M1-4 These could be, for example, three inputs and an output of a three-input NAND gate. Macrocell M2 has three contact points M2-1, M2-2, and M2-3 to provide input and output of the function it implements. Macrocell M3 has three contact points also. Macrocell M4, a larger cell, extends beyond the edge of the figure, and has four contact points within the portion shown. Macrocells M1-M4 all begin at column 1. As can be seen in FIG. 9, macrocell M1 occupies one row and two columns. Macrocell M2, a larger cell, occupies two rows and two columns. Macrocell M3 occupies three rows and two columns.

In the particular embodiment of FIG. 9, each row of active areas can accommodate three routing lines (or tracks) and each tap region can accommodate one track. Each column can accommodate six tracks. Of course other number of tracks are equally possible.

Because of the layout of macrocells M1-M4 and the required interconnections, both those shown in FIG. 9 which connect macrocells to each other and those not shown which interconnect portions of a single macrocell, macrocell M5 cannot be started in column C3. Gates in column C3, rows R1 to R6, must be left unused in order to accommodate the routing tracks. Macrocell M5 may, however, because of the novel symmetrical layout provided by this invention, be started not in column C5 but in column C4. The chip design of FIG. 9 takes advantage of the option provided by this invention of forming CMOS transistors some having the p-channel greater density of used gates. Thus column C7 (not shown) is available for placing subsequent macrocells.

In one implementation of the embodiment described above, 19,000 active gates in this 8.75 mm×8.75 mm chip have been utilized.

This invention also allows for more flexibility in designing a macrocell which will be placed in the library of macrocells. Though the example of FIG. 9 shows macrocells having only an even number of columns, some logic functions can be implemented using a macrocell having an odd number of columns in which some CMOS transistor pairs have their p-channel transistors on the left and some on the right. Particularly in large macrocells, this feature is likely to be needed. The concept is the same as for connecting macrocells to each other: some gate area must be left unused to accommodate routing tracks within the macrocell. However if the number of routing tracks which must be placed over an unused area can be accommodated by a single column then only that single column need be skipped and subsequent CMOS transistor pairs may begin in the next column, of opposite conductivity type.

Figure 1:
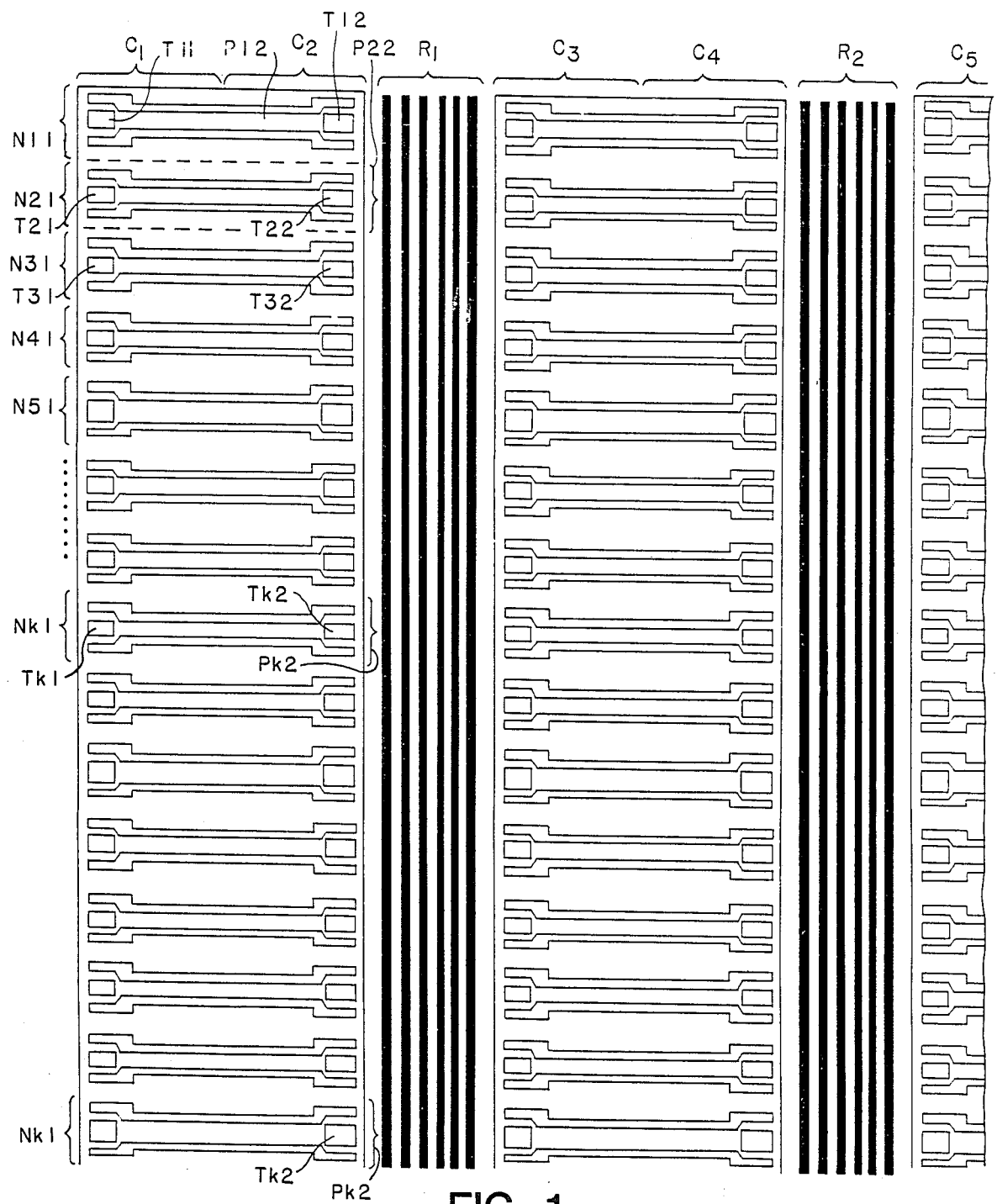
FIG. 1 shows a portion of a prior art gate array geometry with allocated routing channels provided.
Figure 2A:
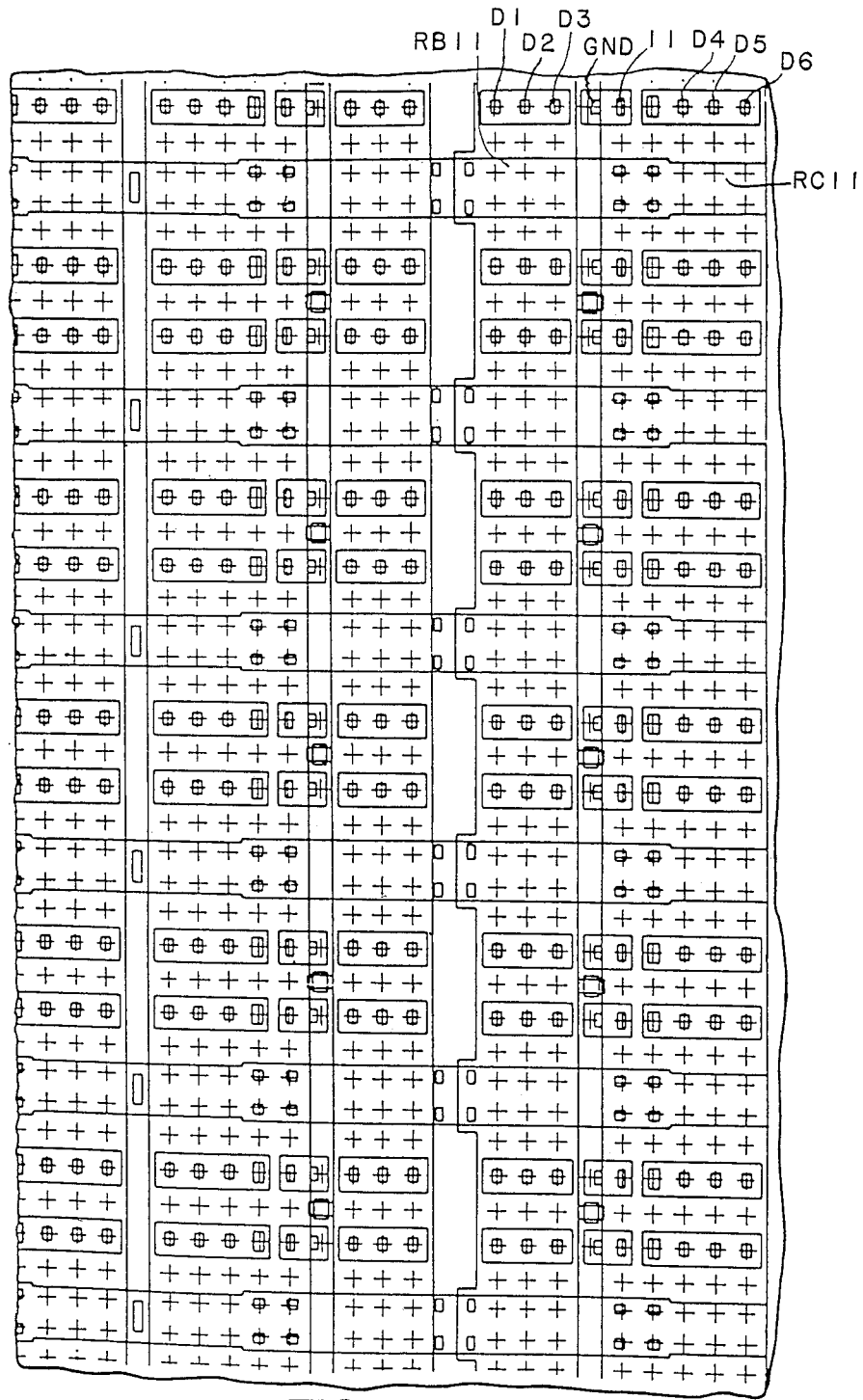
FIG. 2a shows a prior art bipolar non-gate array structure in which no routing channels are provided.
Figure 2B:
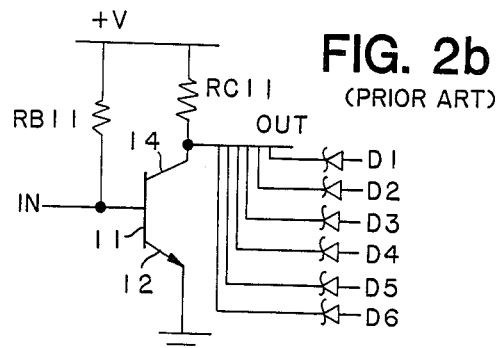
Figure 2C:
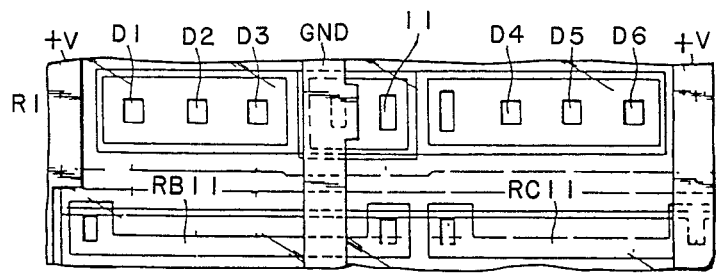
Figure 2D:
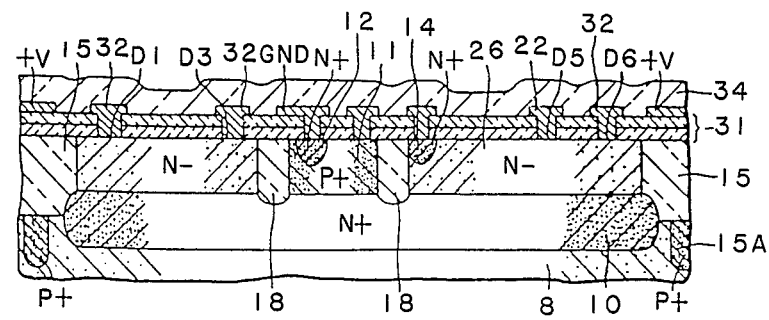

In contrast to the prior art arrangement of FIG. 1, which must provide enough tracks in every channel to accommodate a busy area of the chip and which typically requires dedication of more than half the chip area to routing channels, the arrangement of this invention which applies metal above the compacted gate array, dedicating certain columns to the routing function only after the need for tracks is determined, uses on the average less than ⅓ the total chip area for routing only.

The process steps for forming the compacted array of this invention may be chosen from among well-known process steps. Therefore a detailed description of how the array of this invention is formed is not provided here. Likewise, the process steps for the design and implementation of the metallization are well known and not included here.

Although the embodiment described in detail above uses an n-substrate in which p-wells are formed, the opposite is equally possible, in which a p-substrate has columns of n-wells formed within it. Likewise it is possible to use the twin-tub technology in which adjacent and alternating columns of p-wells and n-wells are formed in a lightly doped substrate of either conductivity type.

Further, although the embodiment described uses columns of equal width, it is possible to form columns of one conductivity type wider than columns of the other conductivity type without departing from the spirit of this invention. The columns of unequal width would nevertheless each be symmetrical about a center line and thus could be paired with an adjacent column on either side to form CMOS devices.

The embodiments of FIGS. 3 and 9 are meant to be exemplary and not limiting. For example, although FIG. 9 shows a wiring pattern in which both the wiring within macrocells and the wiring to connect macrocells to each other can be formed in only two conductive layers, it is of course possible to achieve greater utilization of active areas by using additional conductive layers. As shown, the first conductive layer tracks, such as Y in FIG. 9, for interconnecting macrocells do not cross over macrocells. Thus portions of the first conductive layer above the macrocells can connect regions within the macrocells, and only two conductive layers are used. However, a third conductive layer allows connections between different macrocells to pass directly above connections within a macrocell.

For another example, although FIGS. 6b, 7b, 8b, and 9 show wiring patterns in which conductive lines are formed parallel or perpendicular to the columns, it is possible, and might be preferred in an embodiment using more than two conductive layers where it is important to minimize line length, to form lines in some of the conductive layers at an angle with respect to the direction of the columns. Such an application does not depart from the spirit of this invention.

Many modifications and substitutions will be obvious to one of average skill in the art in view of the above disclosure. For example, although the preferred embodiment provides alternating columns of opposite conductivity type for application to HCMOS device formation, the same concept of forming adjacent symmetrical columns can be applied to forming n-channel devices and would involve forming adjacent columns of p-wells. Likewise, including in the array resistive areas or capacitive areas in addition to the active areas and substrate or well taps which were described in detail above would allow for the formation of macrocells incorporating these elements.

We claim:

1. An integrated circuit gate array structure comprising:
   a semiconductor substrate in which are located columns of semiconductor material of a first conductivity type alternating with and adjacent to columns of semiconductor material of a second conductivity type thereby to leave no intervening area for metal routing, said columns comprising an array of elements, the elements in successive columns of said array being aligned into rows;
   active areas formed within said columns to which can be connected conductive material, thereby forming active devices, each of said active areas comprising:
      a first source/drain region;
      a second source/drain region;
      a third source/drain region;
      a first channel region between said first and second source/drain regions;
      a gate formed above said first channel region to control the conductivity of said first channel region;
      a second channel region between said second and third source/drain regions; and
      a gate formed above said second channel region to control the conductivity of said second channel region;
   tap regions formed within said columns such that tap regions of subsequent columns are aligned into rows, said tap regions having the same conductivity type as the columns in which they are formed and to which can be connected conductive material, said tap regions being more heavily doped than their respective columns thereby to allow current and voltage characteristics of said columns to be controlled;
   said active areas and said tap regions in each column being symmetrical about a center line running the length of each of said columns, thus allowing one of said active areas to be paired with another of said active areas in an adjacent column on either side of said one of said active areas;
   wherein said active areas and said tap regions within one of said columns are placed so as to form a plurality of adjacent cells, each cell consisting of one active area followed by one tap region followed by one active area such that an active area directly abuts an active area in the next adjacent cell.

2. An integrated circuit gate array structure as in claim 1 further comprising
   lines of conductive material formed above said semiconductor substrate, said lines being formed in a plurality of layers, comprising first line in one of said plurality of layers running parallel to said columns and second lines in another of said plurality of layers running perpendicular to said columns; and
   in which a plurality of said second lines are located above
      at least one of said active areas which directly abuts an active area in the next adjacent cell and
      that active area in the next adjacent cell abutted by said at least one of said active areas.

3. An integrated circuit gate array structure as in claim in which said columns of said first conductivity type are identical to each other and said columns of said second conductivity type are identical to each other and of a different width from said columns of said first conductivity type.

4. An integrated circuit gate array structure as in claim 2 in which said lines can be patterned both to form macrocells which implement isolated logic functions in portions of said structure and to connect said macrocells, thereby implementing a complex logic function.

5. An integrated circuit gate array structure as in claim 4 in which said macrocells are placed on said gate array structure starting at one of said columns of either conductivity type, thereby allowing portions of said substrate to be allocated to said lines in units of a single columns.

6. An integrated circuit gate array structure as in claim 5 in which up to six of said lines running parallel to said columns are placed above each of said columns.

* * * * *